US009299579B2

(12) United States Patent
Tomura et al.

(10) Patent No.: US 9,299,579 B2
(45) Date of Patent: Mar. 29, 2016

(54) ETCHING METHOD AND PLASMA PROCESSING APPARATUS

(71) Applicant: Tokyo Electron Limited, Tokyo (JP)

(72) Inventors: Maju Tomura, Miyagi (JP); Hikaru Watanabe, Miyagi (JP); Takahiko Kato, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/623,024

(22) Filed: Feb. 16, 2015

(65) Prior Publication Data

US 2015/0235860 A1 Aug. 20, 2015

(30) Foreign Application Priority Data

Feb. 19, 2014 (JP) ................................. 2014-029611

(51) Int. Cl.
*H01L 21/302* (2006.01)
*H01L 21/311* (2006.01)
*H01L 21/67* (2006.01)
*H01J 37/32* (2006.01)

(52) U.S. Cl.
CPC ......... *H01L 21/311* (2013.01); *H01J 37/32137* (2013.01); *H01J 37/32449* (2013.01); *H01J 37/32724* (2013.01); *H01L 21/67069* (2013.01); *H01J 2237/334* (2013.01)

(58) Field of Classification Search
CPC ............. H01L 21/302; H01L 21/32091; H01J 37/32926; H01J 37/32091

USPC ............................... 216/37, 67; 438/689–694
See application file for complete search history.

(56) References Cited

U.S. PATENT DOCUMENTS

| 5,328,558 | A | 7/1994 | Kawamura |
| 6,376,386 | B1 * | 4/2002 | Oshima .......................... 438/714 |
| 6,617,253 | B1 | 9/2003 | Chu |
| 8,617,348 | B1 * | 12/2013 | Liu et al. ................... 156/345.31 |
| 2012/0064726 | A1 | 3/2012 | Nozawa |

FOREIGN PATENT DOCUMENTS

EP 1 001 454 A2 5/2000
JP 2000-307001 A 11/2000

OTHER PUBLICATIONS

Kikuchi, et. al., "Cleaning of Silicon Surfaces by NF3-Added Hydrogen and Water-Vapor Plasma Downstream Treatment", Journal of Applied Physics, vol. 35, pp. 1022-1026, 1996.
Nishino, et. al., "Damage-free Selective Etching of Si Native Oxides Using NH3/NF3 and SF6/H2O Down-flow Etching", Toshiba Corporation, 1993, Kawasaki, Japan.

* cited by examiner

*Primary Examiner* — Duy Deo
*Assistant Examiner* — Maki Angadi
(74) *Attorney, Agent, or Firm* — Pearne & Gordon LLP

(57) ABSTRACT

An etching method of selectively etching a first region formed of silicon oxide with respect to a second region formed of silicon nitride includes: a process (a) and a process (b). In the process (a), a target object is exposed to plasma of a fluorocarbon gas and a thickness of a protective film on the second region is larger than a thickness of a protective film formed on the first region. In the process (b), the first region is etched by plasma of a fluorocarbon gas. In the process (a), a temperature of the target object is set to 60° C. or more to 250° C. or less.

8 Claims, 6 Drawing Sheets

ETCHING METHOD AND PLASMA PROCESSING APPARATUS

CROSS-REFERENCE TO RELATED APPLICATION

This application claims the benefit of Japanese Patent Application No. 2014-029611 filed on Feb. 19, 2014, the disclosures of which are incorporated herein by reference.

TECHNICAL FIELD

The embodiments described herein pertain generally to an etching method and a plasma processing apparatus.

BACKGROUND

In manufacturing semiconductor devices, contact holes may be formed in a silicon oxide film. Further, as the semiconductor devices have been miniaturized, a SAC (Self-Aligned Contact) technique has been used to form the contact holes.

The SAC technique is to form contact holes in a silicon oxide film provided between, for example, two gates. To be specific, a silicon nitride film covering two gates is formed between the gates and a silicon oxide film. Since the silicon nitride film serves as an etching stop layer, a contact hole is formed in a self-aligned manner in the silicon oxide film provided in a region between the two gates. In such a SAC technique, generally, plasma of a fluorocarbon gas is used for etching the silicon oxide film, as described in Patent Document 1.

Patent Document 1: Japanese Patent Laid-open Publication No. 2000-307001

In manufacturing semiconductor devices by using the above-described SAC technique, a region formed of silicon oxide may be selectively etched with respect to a region formed of silicon nitride. However, not only the region formed of silicon oxide but also the region formed of silicon nitride is etched by plasma of a fluorocarbon gas. By way of example, in the conventional SAC technique, when a silicon nitride film is exposed by etching a silicon oxide film, the silicon nitride film may also be etched.

Therefore, in selectively etching the region formed of silicon oxide, it becomes necessary to suppress the region formed of silicon nitride from being etched.

SUMMARY

In one example embodiment, an etching method of selectively etching a first region formed of silicon oxide with respect to a second region formed of silicon nitride includes: a protective film forming process (hereinafter, referred to as "process (a)") of forming a protective film such that a thickness of the protective film on the second region is larger than a thickness of the protective film formed on the first region by exposing a target object including the first region and the second region to plasma of a fluorocarbon gas; and a first region etching process (hereinafter, referred to as "process (b)") of etching the first region by exposing the target object to plasma of a fluorocarbon gas. In this method, a high frequency bias power supplied to a mounting table configured to mount the target object thereon in the process (a) is set to be lower than a high frequency bias power supplied to the mounting table in the process (b). By way of example, in the process (a), the high frequency bias power may not be supplied to the mounting table. Further, in the process (a) of this method, a temperature of the target object is set to 60° C. or more to 250° C. or less.

In a temperature range of 60° C. or more to 250° C. or less, a thickness of a fluorocarbon-based protective film formed on the second region is greater than a thickness of the protective film formed on the first region. Further, while a relatively low bias power is supplied, an etching rate in the second region is decreased. Therefore, according to the above-described method, a thick protective film can be formed on the second region in the process (a). Thus, when the first region is selectively etched in the process (b), it is possible to suppress the second region from being etched.

In the example embodiment, the second region may be buried in the first region. The etching method may further include: a modified region forming process (hereinafter, referred to as "process (c)") of modifying the first region into a modified region by generating plasma of a gas containing hydrogen, nitrogen, and fluorine; and a modified region removing process (hereinafter, referred to as "process (d)") of removing the modified region. In the etching method, the process (a) and the process (b) may be performed after the second region is exposed through the process (c) and the process (d). In this example embodiment, the silicon oxide in the first region is modified into ammonium fluorosilicate through the process (c) and the process (d), and the modified region formed of the ammonium fluorosilicate is removed by the process (d). The process (c) and the process (d) are selectively performed on the first region, so that it is possible to expose the second region while suppressing the second region from being damaged. The process (a) and the process (b) are performed after the process (c) and the process (d). Thus, even after the second region is exposed, it is possible to etch the first region while suppressing the second region from being damaged. Further, in the process (d), the target object may be heated, or the target object may be exposed to plasma of an inert gas.

In the example embodiment, a gas containing at least one of $C_4F_6$, $C_4F_8$, and $C_6F_6$ may be used as the fluorocarbon gas. Further, in the example embodiment, the process (a) and the process (b) may be alternately performed.

In another example embodiment, a plasma processing apparatus can be used for performing the above-described method. The plasma processing apparatus includes a processing chamber, a mounting table, a temperature control unit, a gas supply unit, a plasma generation unit, a power supply unit, and a control unit. The mounting table is provided within the processing chamber and configured to mount a target object thereon. The temperature control unit is configured to control a temperature of the mounting table. The gas supply unit is configured to supply, into the processing chamber, a first gas containing hydrogen, nitrogen, and fluorine, a second gas containing fluorocarbon, and a third gas containing fluorocarbon. The plasma generation unit is configured to generate energy to excite the gas supplied into the processing chamber. The power supply unit is configured to supply a high frequency bias power to the mounting table. The control unit is configured to control the temperature control unit, the gas supply unit, the plasma generation unit, and the power supply unit. Further, the control unit is configured to perform a first control to supply the first gas by the gas supply unit and generate energy by the plasma generation unit; a second control to heat the mounting table by the temperature control unit; a third control to supply the second gas by the gas supply unit and generate energy by the plasma generation unit; and a fourth control to supply the third gas by the gas supply unit and generate energy by the plasma generation unit. Moreover, the control unit is configured to control the power supply unit such that a high frequency bias power supplied to the mounting table in the third control is set to be lower than a high frequency bias power supplied to the mounting table in the fourth control, and configured to control the temperature control unit to set a temperature of the mounting table to 60° C. or more to 250° C. or less in the third control. According to this plasma processing apparatus, the above-described processes (a), (b), (c), and (d) can be performed in a single plasma processing apparatus.

In yet another example embodiment, a plasma processing apparatus can be used for performing the above-described method. The plasma processing apparatus includes a processing chamber, a mounting table, a temperature control unit, a gas supply unit, a plasma generation unit, a power supply unit, and a control unit. The mounting table is provided within the processing chamber and configured to mount a target object thereon. The temperature control unit is configured to control a temperature of the mounting table. The gas supply unit is configured to supply, into the processing chamber, a first gas containing hydrogen, nitrogen, and fluorine, a second gas containing fluorocarbon, a third gas containing fluorocarbon, and an inert gas. The plasma generation unit is configured to generate energy to excite the gases supplied into the processing chamber. The power supply unit is configured to supply a high frequency bias power to the mounting table. The control unit is configured to control the temperature control unit, the gas supply unit, the plasma generation unit, and the power supply unit. The control unit is configured to perform a first control to supply the first gas by the gas supply unit and generate energy by the plasma generation unit; a second control to supply the inert gas by the gas supply unit and generate energy by the plasma generation unit; a third control to supply the second gas by the gas supply unit and generate energy by the plasma generation unit; and a fourth control to supply the third gas by the gas supply unit and generate energy by the plasma generation unit. Further, the control unit is configured to control the power supply unit such that a high frequency bias power supplied to the mounting table in the third control is set to be lower than a high frequency bias power supplied to the mounting table in the fourth control, and configured to control the temperature control unit to set a temperature of the mounting table to 60° C. or more to 250° C. or less in the third control. According to this plasma processing apparatus, the above-described processes (a), (b), (c), and (d) can also be performed in a single plasma processing apparatus.

In the example embodiment, the second gas may contain at least one of $C_4F_6$, $C_4F_8$, and $C_6F_6$. Further, in the example embodiment, the control unit may be configured to perform the third control and the fourth control after alternately performing the first control and the second control. Furthermore, the control unit may alternately perform the third control and the fourth control.

As described above, in selectively etching a region formed of silicon oxide, it is possible to suppress a region formed of silicon nitride from being etched.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
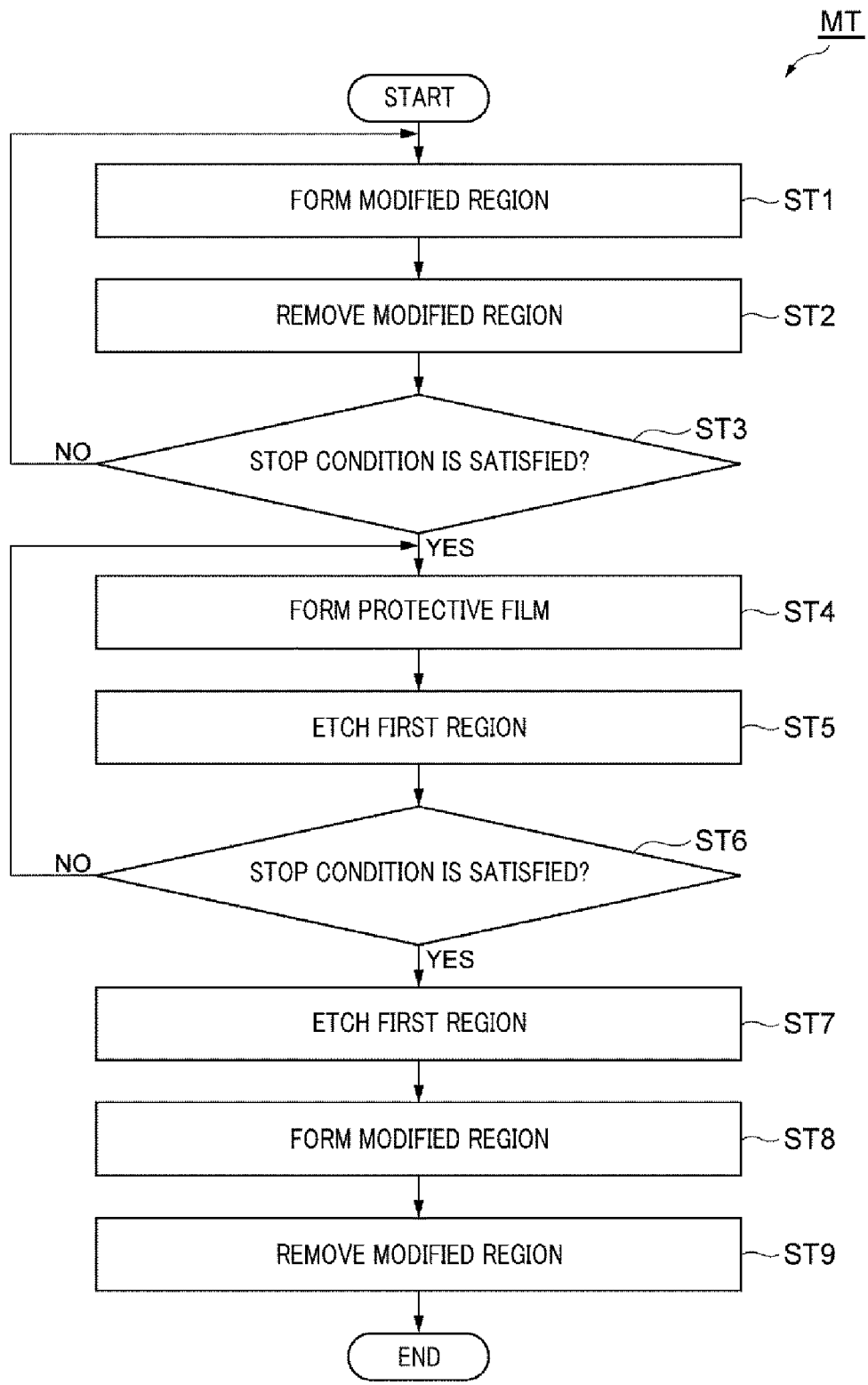
FIG. 1 is a flow chart illustrating an etching method in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flow chart illustrating an etching method in accordance with an example embodiment. By performing a method MT illustrated in FIG. 1, a first region formed of silicon oxide can be selectively etched with respect to a second region formed of silicon nitride. In the example embodiment, the method MT may be used for forming a hole in a self-aligned manner in a target object illustrated in FIG. 2.

The target object (hereinafter, referred to as "wafer W") of the example embodiment illustrated in FIG. 2 includes an underlying layer 100, multiple protruding regions 102, a second region 104, a first region 106, and a mask 108. The wafer W may be a product obtained, for example, during the manufacturing process of a fin-type field effect transistor.

The underlying layer 100 may be formed of, for example, polycrystalline silicon. In the example embodiment, the underlying layer may be a fin region, and has a substantially hexahedral shape. The multiple protruding regions 102 are formed on the underlying layer 100 and arranged to be substantially parallel to one another. These protruding regions 102 may be, for example, gate regions. The second region 104 is formed of silicon nitride to cover the protruding regions 102. Further, the multiple protruding regions 102 are buried in the first region 106. That is, the first region 106 is formed to cover the protruding regions 102 via the second region 104. The first region 106 is formed of silicon oxide. The mask 108 is formed on the first region 106. The mask 108 has a pattern in which an opening is formed above and between the adjacent protruding regions 102. This mask 108 is formed of an organic film. Further, the mask 108 can be fabricated by the photolithography.

If the method MT is performed on the wafer W, the first region 106 of the wafer W can be selectively etched with respect to the second region 104, so that a hole can be formed in a self-aligned manner between the adjacent protruding regions 102. The hole is extended to a surface of the underlying layer 100 through a region between the adjacent protruding regions 102. The hole may be, for example, a contact hole connected to a source or a drain in the fin region.

Figure 3:
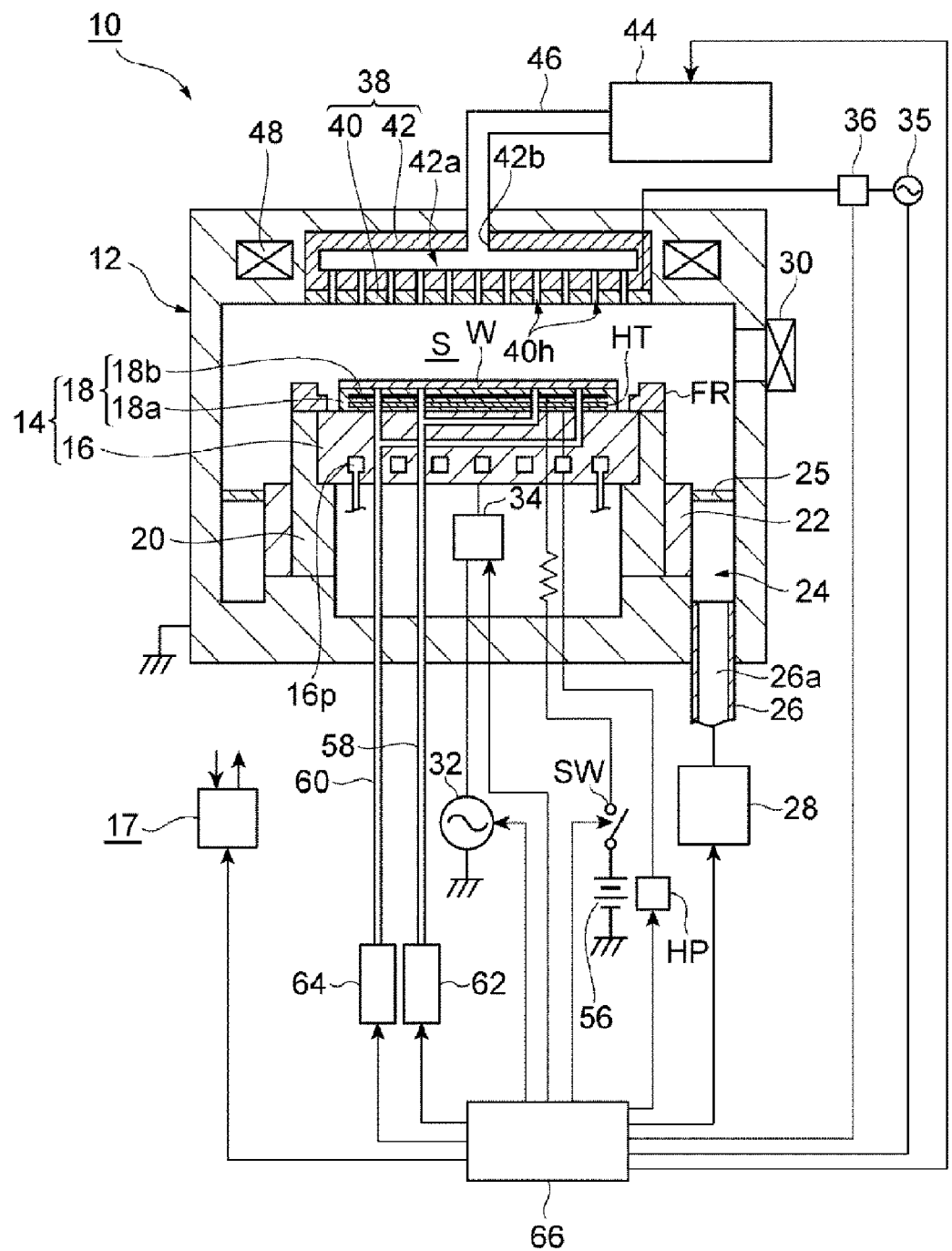
FIG. 3 is a diagram schematically illustrating a plasma processing apparatus in accordance with the example embodiment.

Hereinafter, a plasma processing apparatus in which the method MT is performed will be described before processes of the method MT are described in detail. FIG. 3 is a diagram illustrating the plasma processing apparatus in accordance with the example embodiment. A plasma processing apparatus 10 illustrated in FIG. 3 is configured as a capacitively coupled plasma processing apparatus.

The plasma processing apparatus 10 includes a processing chamber 12. The processing chamber 12 has a substantially cylindrical shape, and includes a processing space S therein. At a side wall of the processing chamber 12, an opening for loading and unloading a wafer W is formed. This opening can be opened and closed by a gate valve 30.

The plasma processing apparatus 10 includes a mounting table 14 within the processing chamber 12. In the example embodiment, the plasma processing apparatus 10 further includes a cylindrical holding unit 20 and a cylindrical supporting unit 22. The cylindrical holding unit 20 is extended upwards from a bottom portion of the processing chamber 12 and configured to hold the mounting table 14. The cylindrical supporting unit 22 is extended upwards from the bottom portion of the processing chamber 12 and configured to support the mounting table 14 via the cylindrical holding unit 20.

The mounting table 14 includes a base member 16 and an electrostatic chuck 18. The base member 16 has a substantially circular plate shape and has conductivity. The base member 16 is made of, for example, aluminum and serves as a lower electrode.

The base member 16 is electrically connected to a high frequency power supply 32 via a matching unit 34. In the example embodiment, the high frequency power supply 32 is configured to supply a high frequency bias power having a preset frequency of, for example, 400 kHz to 13.56 MHz for ion attraction to the base member 16. The high frequency power supply 32 is configured as a power supply unit in the example embodiment.

The electrostatic chuck 18 is provided on the base member 16. The electrostatic chuck 18 is a member having a substantially circular plate shape, and includes an insulating layer 18a and a power supply layer 18b. The insulating layer 18a is a film formed of a dielectric material such as ceramic or the like, and the power supply layer 18b is a conductive film formed as an inner layer of the insulating layer 18a. The power supply layer 18b is connected to a DC power supply 56 via a switch SW. If a DC voltage is applied to the power supply layer 18b from the DC power supply 56, a Coulomb force is generated. The wafer W is attracted to and held on the electrostatic chuck 18 by the Coulomb force.

Further, outside an edge of the electrostatic chuck 18 and outside an edge of the wafer W, a focus ring FR is provided to surround the electrostatic chuck 18 and the wafer W. The focus ring FR may be formed of, for example, silicon or quartz.

In the example embodiment, a gas exhaust path 24 is formed between the side wall of the processing chamber 12 and the cylindrical supporting unit 22. A baffle plate 25 is provided on a portion of the gas exhaust path 24. Further, a gas exhaust opening 26a is formed at a bottom portion of the gas exhaust path 24. The gas exhaust opening 26a is formed by a gas exhaust line 26 fitted into the bottom portion of the processing chamber 12. The gas exhaust line 26 is connected to a gas exhaust device 28. The gas exhaust device 28 includes a vacuum pump and is configured to depressurize the processing space S within the processing chamber 12 to a preset vacuum level.

Further, the plasma processing apparatus 10 further includes a temperature control unit in accordance with the example embodiment. The temperature control unit controls a temperature of a wafer mounted on the mounting table 14 by adjusting a temperature of the mounting table 14. Hereinafter, the temperature control unit will be described in detail.

A coolant path 16p is formed within the base member 16. One end of the coolant path 16p is connected to an inlet line, and the other end of the coolant path 16p is connected to an outlet line. The inlet line and the outlet line are connected to a chiller unit 17. The chiller unit 17 is configured to supply a coolant to the coolant path 16p through the inlet line and is configured to receive the coolant from the coolant path 16p through the outlet line. Since the coolant is circulated through the coolant path 16p, the temperature of the mounting table 14 can be controlled, so that the temperature of the wafer W mounted on the mounting table 14 can be controlled.

Further, the mounting table 14 includes a heater HT as a heating member. By way of example, the heater HT is buried in the electrostatic chuck 18. The heater HT is connected to a heater power supply HP. Since a power is supplied from the heater power supply HP to the heater HT, the temperature of the mounting table 14 can be controlled, so that the temperature of the wafer mounted on the mounting table 14 can be controlled.

In the example embodiment, the plasma processing apparatus 10 further includes gas supply lines 58 and 60, and heat transfer gas supply units 62 and 64. The heat transfer gas supply unit 62 is connected to the gas supply line 58. The gas supply line 58 is extended to an upper surface of the electrostatic chuck 18 and annularly extended on a central portion of the upper surface thereof. The heat transfer gas supply unit 62 is configured to supply a heat transfer gas such as a He gas into a space between the upper surface of the electrostatic chuck 18 and the wafer W. Further, the heat transfer gas supply unit 64 is connected to the gas supply line 60. The gas supply line 60 is extended to the upper surface of the electrostatic chuck 18 and annularly extended to surround the gas supply line 58 on the upper surface thereof. The heat transfer gas supply unit 64 is configured to supply a heat transfer gas such as a He gas into a space between the upper surface of the electrostatic chuck 18 and the wafer W.

Further, the plasma processing apparatus 10 further includes a gas supply unit and a plasma generation unit in accordance with the example embodiment. The gas supply unit can supply multiple gases into the processing chamber 12 and selectively supply a gas used in each process of the method MT into the processing chamber 12. The plasma generation unit is configured to generate energy for exciting a gas supplied into the processing chamber 12. Hereinafter, the gas supply unit and the plasma generation unit in accordance with the example embodiment will be described in detail.

The plasma processing apparatus 10 includes a shower head 38. The shower head 38 is provided above the mounting table 14, and faces the mounting table 14 via the processing space S. The shower head 38 serves as an upper electrode, and includes an electrode plate 40 and an electrode supporting member 42.

The electrode plate 40 is a conductive plate having a substantially circular plate shape. The electrode plate 40 is electrically connected to a high frequency power supply 35 via a matching unit 36. The high frequency power supply 35 is configured to supply a high frequency power having a preset frequency of, for example, 40 MHz to 100 MHz for plasma generation to the electrode plate 40. By applying the high frequency power from the high frequency power supply 35 to the electrode plate 40, a high frequency electric field is generated in a space, i.e., the processing space S, between the base member 16 and the electrode plate 40, so that a gas is excited by the high frequency electric field. Thus, plasma is generated within the processing chamber 12. Therefore, the base member 16, the shower head 38, and the high frequency power supply 35 constitute the plasma generation unit in accordance with the example embodiment.

In the electrode plate 40, multiple gas discharge holes 40h are formed. The electrode plate 40 is detachably supported on the electrode supporting member 42. A buffer room 42a is formed within the electrode supporting member 42. Further, multiple holes respectively connecting the multiple gas discharge holes 40h are formed in the electrode supporting member 42 to communicate with the buffer room 42a. Further, the plasma processing apparatus 10 further includes a gas supply unit 44, and a gas inlet opening 42b of the buffer room 42a is connected to the gas supply unit 44 via a gas supply line 46.

The gas supply unit 44 is configured to selectively supply a gas used in each process of the method MT to the shower head 38. To be specific, the gas supply unit 44 may supply a first gas, a second gas, a third gas, and an inert gas. The first gas contains hydrogen, nitrogen, and fluorine. The second gas and the third gas contain fluorocarbon. The first gas may be a mixture of, for example, a $H_2$ gas, a $N_2$ gas, and a $NF_3$ gas. The first gas may further contain a rare gas such as an Ar gas. Further, the second gas and the third gas contain at least one of $C_4F_6$, $C_4F_8$, and $C_6F_6$. The second gas and the third gas may further contain a rare gas such as an Ar gas and an $O_2$ gas. Furthermore, the inert gas may be a rare gas such as an Ar gas or a $N_2$ gas.

The gas supply unit 44 may include gas sources for the above-described multiple gases, flow rate controllers and valves provided corresponding to the respective gas sources. The gas supply unit 44 is configured to selectively supply one or more gases used in each process among the multiple gases to the shower head 38. Thus, the gas supply unit 44 can selectively supply the first gas, the second gas, the third gas, and the inert gas to the shower head 38. The gas supplied to the shower head 38 is introduced to the processing space S via the buffer room 42a and the gas discharge holes 40h. Therefore, the gas supply unit 44 and the shower head 38 constitute a gas supply unit in accordance with the example embodiment.

In an example embodiment, there is provided a magnetic field generating unit 48 annularly or concentrically extended at a ceiling portion of the processing chamber 12. The magnetic field generating unit 48 is configured to allow a high frequency electric discharge (plasma ignition) to be easily started in the processing space S and configured to stably maintain the electric discharge.

In the example embodiment, the plasma processing apparatus 10 further includes a control unit 66. The control unit 66 is connected to the chiller unit 17, the gas exhaust device 28, the switch SW, the high frequency power supply 32, the matching unit 34, the high frequency power supply 35, the matching unit 36, the gas supply unit 44, the heat transfer gas supply units 62 and 64, and the heater power supply HP. The control unit 66 is configured to output a control signal to each of the gas exhaust device 28, the switch SW, the high frequency power supply 32, the matching unit 34, the high frequency power supply 35, the matching unit 36, the gas supply unit 44, the heat transfer gas supply units 62 and 64, and the heater power supply HP. By the control signal from the control unit 66, supply of the coolant by the chiller unit 17, exhaust by the gas exhaust device 28, opening/closing by the switch SW, supply of the high frequency bias power by the high frequency power supply 32, impedance matching by the matching unit 34, supply of the high frequency power by the high frequency power supply 35, impedance matching by the matching unit 36, supply of the gas by the gas supply unit 44, supply of the heat transfer gas by each of the heat transfer gas supply units 62 and 64, and supply of the power by the heater power supply HP can be controlled.

Hereinafter, processes of the method MT and various controls by the control unit 66 will be described in detail. Hereinafter, FIG. 1 will be referred to again. Further, in the following description, FIG. 4A to FIG. 6C will be referred to. FIG. 4A to FIG. 6C are cross-sectional views respectively illustrating target objects after performing respective processes of the etching method in accordance with the example embodiment.

Figure 4A:
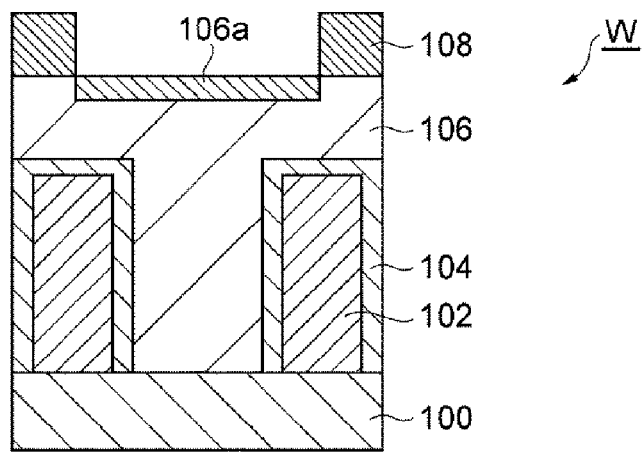
FIG. 4A to FIG. 4C are cross-sectional views respectively illustrating the target objects after performing respective processes of the etching method in accordance with the example embodiment.

As illustrated in FIG. 1, the method MT starts from a process ST1 (Form modified region). In the process ST1, a modified (reformed) region is formed by modifying (reforming) the first region 106. To be specific, in the process ST1, the wafer W is exposed to plasma of a gas containing hydrogen, nitrogen, and fluorine. The gas used in the process ST1 is the above-described first gas and may be a mixture of, for example, a $H_2$ gas, a $N_2$ gas, and a $NF_3$ gas. Further, the first gas may contain a rare gas such as an Ar gas. When the wafer W is exposed to the plasma of the first gas, silicon oxide contained in the first region 106 is modified into ammonium fluorosilicate. Thus, as depicted in FIG. 4A, at least a part of the first region 106 is modified into a modified region 106a.

When the process ST1 is performed in the plasma processing apparatus 10, the control unit 66 performs a first control. To be specific, the control unit 66 controls the gas supply unit 44 to supply the first gas. Further, the control unit 66 controls the high frequency power supply 35 to supply the high frequency power to the shower head 38 in order to excite the first gas.

In the process ST1, a pressure within the processing chamber 12 is set to, for example, 400 mTorr to 600 mTorr (53.33 Pa to 79.99 Pa). Further, the high frequency power supplied from the high frequency power supply 35 is set to, for example, 800 W to 1200 W. Further, in the process ST1, the high frequency bias power may not be supplied from the high frequency power supply 32. Furthermore, partial pressures of a $NF_3$ gas and a $H_2$ gas in the first gas are controlled to be in a range of 1:2 to 1:10, for example, 1:2.5. Moreover, a temperature of the wafer W is controlled to 40° C. or less, for example, 0° C. To this end, the control unit 66 controls the temperature control unit of the plasma processing apparatus 10 to adjust the temperature of the mounting table 14.

Figure 4B:
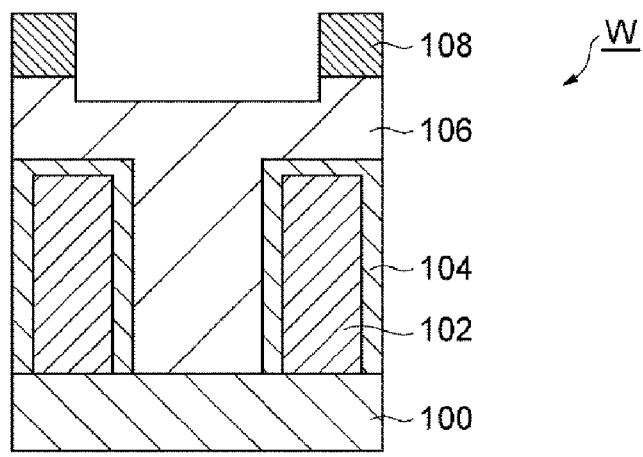

Then, in the method MT, a process ST2 (Remove modified region) is performed. In the process ST2, the modified region 106a is removed. In the example embodiment, the wafer W is heated in the process ST2. In another example embodiment, the wafer W may be exposed to plasma of an inert gas in the process ST2. Through the process ST2, the modified region 106a is removed as illustrated in FIG. 4B.

When the process ST2 is performed in the plasma processing apparatus 10, the control unit 66 performs a second control. In the example embodiment, the control unit 66 controls the temperature control unit of the plasma processing apparatus 10 to adjust the temperature of the mounting table 14. Thus, the wafer W is heated. By way of example, the wafer W is heated to, for example, 60° C. to 250° C. Further, in this example embodiment, through the second control, an inert gas such as a $N_2$ gas may be supplied into the processing chamber 12.

In another example of the second control, the control unit 66 controls the gas supply unit 44 to supply the inert gas. Further, the control unit 66 controls the high frequency power supply 35 to supply the high frequency power to the shower head 38 in order to excite the inert gas. Furthermore, the control unit 66 may control the high frequency power supply 32 to supply the high frequency bias power.

Figure 4C:
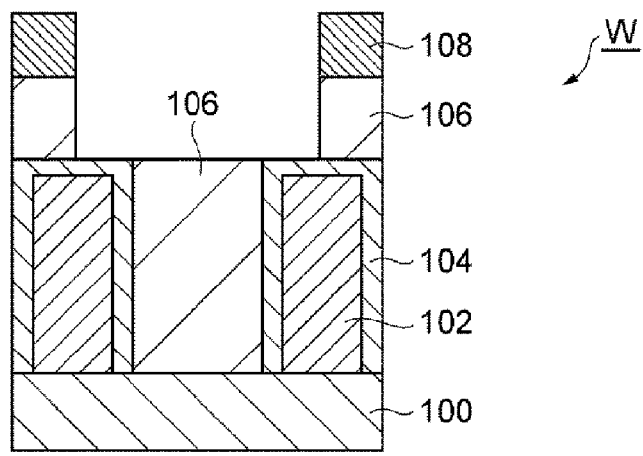

The process ST1 and the process ST2 are alternately performed a preset number of times (for example, 10 times) until the second region 104 is exposed. In a process ST3 (Stop condition is satisfied?) of the method MT, it is determined whether or not the number of times of performing the process ST1 and the process ST2 satisfies a stop condition, i.e., a condition of exceeding a certain number of times. If the stop condition is not satisfied, the process ST1 and the process ST2 are repeated again. On the other hand, if the stop condition is satisfied, the process ST1 and the process ST2 are ended. As described above, since the process ST1 and the process ST2 are alternately performed a preset number of times, the first region 106 is partially removed as depicted in FIG. 4C, so that the second region 104 is exposed. Further, the process ST1 and the process ST2 are selectively performed with respect to the first region 106. As a result, even after the second region 104 is exposed, it is possible to suppress the second region 104 from being damaged.

Then, in the method MT, a process ST4 (Form protective film) is performed. In the process ST4, a protective film is formed on the second region 104 and the first region 106. In the process ST4, the protective films is formed such that a thickness of the protective film formed on the second region 104 can be greater than a thickness of the protective film formed on the first region 106.

To be specific, in the process ST4, the wafer W is exposed to plasma of a fluorocarbon gas, i.e., the second gas containing fluorocarbon. In the process ST4, the high frequency bias power supplied to the base member 16 of the mounting table 14 is controlled to be lower than the high frequency bias power to be supplied to the base member 16 in a process ST5 (Etch first region) to be described below. By way of example, in the process ST4, the high frequency bias power may not be supplied to the base member 16. Thus, an etching rate of the second region 104 is decreased, so that the second region 104 is substantially not etched.

Figure 5A:
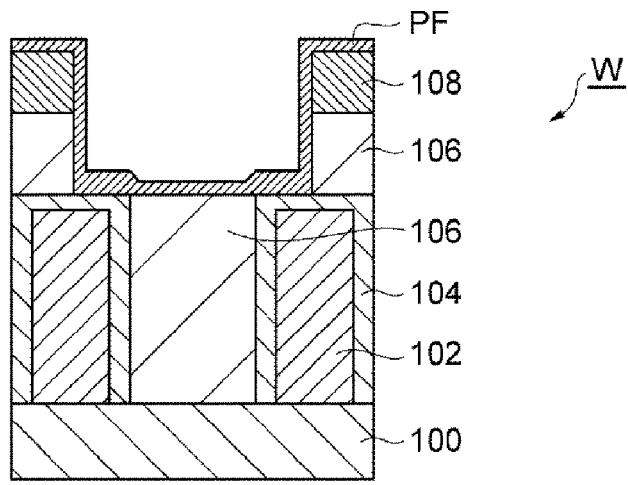
FIG. 5A to FIG. 5C are cross-sectional views respectively illustrating the target objects after performing respective processes of the etching method in accordance with the example embodiment.

Further, in the process ST4, the temperature of the wafer W is set to 60° C. or more to 250° C. or less. Thus, as depicted in FIG. 5A, a fluorocarbon-based protective film PF is formed on the second region 104 and the first region 106, and a thickness of the protective film PF on the first region 106 is greater than a thickness of the protective film PF on the second region 106. In a temperature range of more than 250° C., the temperature becomes a glass transition temperature of the mask 108, and a difference between the thickness of the protective film formed on the first region 106 and the thickness of the protective film formed on the second region 104 is decreased. Further, at a temperature of less than 60° C., a difference between the thickness of the protective film formed on the first region 106 and the thickness of the protective film formed on the second region 104 is decreased.

When the process ST4 is performed in the plasma processing apparatus 10, the control unit 66 performs a third control. To be specific, the control unit 66 controls the gas supply unit 44 to supply the second gas. Further, the control unit 66 controls the high frequency power supply 35 to supply the high frequency power to the shower head 38. Furthermore, the control unit 66 controls the high frequency power supply 32 to set the high frequency bias power to be low, for example, not to supply the high frequency bias power. Moreover, the control unit 66 controls the temperature control unit of the plasma processing apparatus 10 to adjust the temperature of the mounting table 14. Thus, the temperature of the wafer W can be controlled.

By way of example, in the process ST4, a pressure within the processing chamber 12 is set to 10 mTorr to 30 mTorr (1.333 Pa to 4 Pa). Further, in the process ST4, a high frequency power of 500 W to 2000 W with 60 MHz is supplied from the high frequency power supply 35 to the shower head 38. Furthermore, flow rates of a $C_4F_6$ gas, an Ar gas, an $O_2$ gas contained in the second gas are set to 15 sccm to 25 sccm, 500 sccm to 600 sccm, and 10 sccm to 20 sccm, respectively. Moreover, a processing time of the process ST4 is set to 10 seconds to 20 seconds.

Then, in the method MT, the process ST5 is performed. In the process ST5, the first region 106 is etched. In the present example embodiment, the first region 106 between the adjacent protruding regions 102 is etched.

Figure 5B:
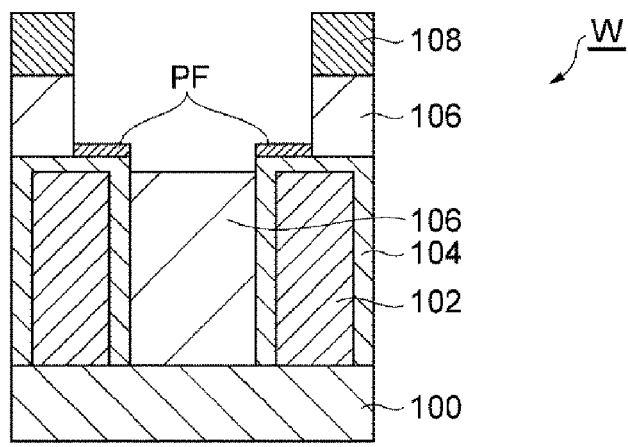

To be specific, in the process ST5, the wafer W is exposed to plasma of a fluorocarbon gas, i.e., the third gas containing fluorocarbon. In the process ST5, a relatively high frequency bias power is supplied to the base member 16 of the mounting table 14. Thus, the first region 106 on which a relatively thin protective film PF is formed is etched as depicted in FIG. 5B.

When the process ST5 is performed in the plasma processing apparatus 10, the control unit 66 performs a fourth control. To be specific, the control unit 66 controls the gas supply unit 44 to supply the third gas. Further, the control unit 66 controls the high frequency power supply 35 to supply the high frequency power to the shower head 38. Furthermore, the control unit 66 controls the high frequency power supply 32 to supply the high frequency bias power to the base member 16.

By way of example, in the process ST5, a pressure within the processing chamber 12 is set to 10 mTorr to 30 mTorr (1.333 Pa to 4 Pa). Further, in the process ST5, a high frequency power of 500 W to 2000 W with a frequency of 60 MHz is supplied from the high frequency power supply 35 to the shower head 38. Furthermore, in the process ST5, a high frequency bias power of 1000 W to 2000 W is supplied from the high frequency power supply 32 to the base member 16. Moreover, flow rates of a $C_4F_6$ gas, an Ar gas, an $O_2$ gas contained in the third gas are set to 15 sccm to 25 sccm, 500 sccm to 600 sccm, and 10 sccm to 20 sccm, respectively. Further, a processing time of the process ST5 is set to 10 seconds to 30 seconds. Furthermore, the temperature of the wafer W in the process ST5 may be equal to or lower than the temperature of the wafer W in the process ST4.

Figure 5C:
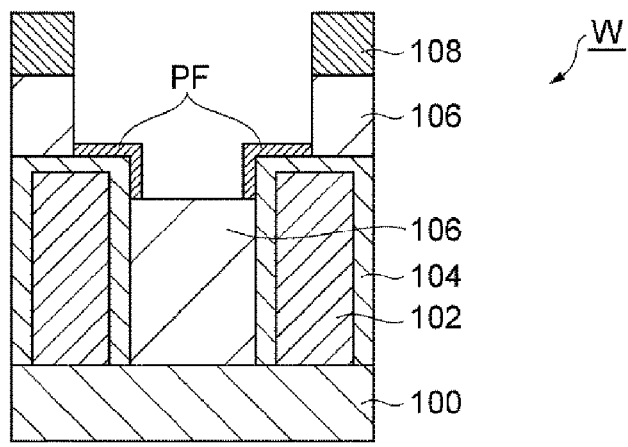

In the method MT, the process ST4 and the process ST5 are alternately performed a preset number of times. In a process ST6 (Stop condition is satisfied?) of the method MT, it is determined whether or not the number of times of performing the process ST4 and the process ST5 satisfies a stop condition, i.e., a condition of exceeding a certain number of times. If the stop condition is not satisfied, the process ST4 and the process ST5 are repeated again. On the other hand, if the stop condition is satisfied, the process ST4 and the process ST5 are ended. As described above, since the process ST4 and the process ST5 are alternately performed the preset number of times, the first region 106 between the adjacent protruding regions 102 is etched to a certain depth as depicted in FIG. 5C. Further, in FIG. 5C, the first region 106 is not etched down to the underlying layer 100, but the process ST4 and the process ST5 may be performed until the first region 106 is etched down to the underlying layer 100.

By performing the process ST4 and the process ST5, it is possible to etch the first region 106 while suppressing the second region 104, on which a protective film is not formed right after being exposed, from being etched. When the process ST4 and the process ST5 are performed a preset number of times, the protective film PF is maintained on the second region 104. Further, in performing the etching process with a fluorocarbon-containing gas, the protective film is formed on the first region 106 at the same time of etching the first region 106. Therefore, after the process ST4 and the process ST5 are performed the preset number of times, the first region 106 may be etched in the same manner as performed in the process ST5. Thus, an etching rate of the first region 106 can be increased.

Figure 6A:
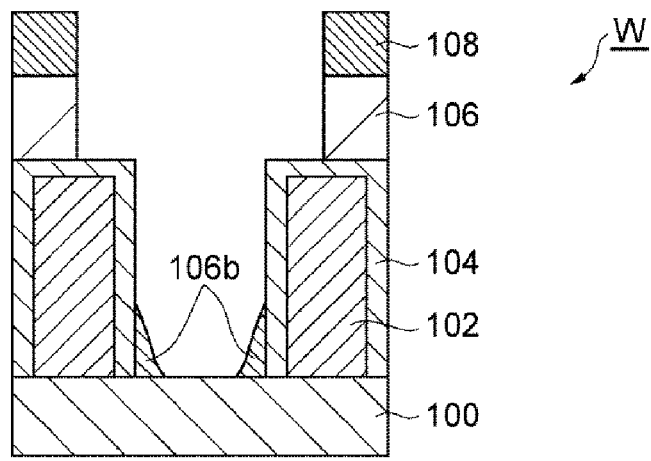
FIG. 6A to FIG. 6C are cross-sectional views respectively illustrating the target objects after performing respective processes of the etching method in accordance with the example embodiment.

To be specific, the method MT includes a process ST7 (Etch first region). In the process ST7, the first region 106 between the adjacent protruding regions 102 is etched under the same conditions as those of the process ST5. When the process ST7 is performed in the plasma processing apparatus 10, the control unit 66 may perform the same control as the fourth control. If the process ST7 is performed, in the wafer W, a hole extended to the underlying layer 100 is formed as depicted in FIG. 6A. However, as depicted in FIG. 6A, at an edge portion surrounded by the underlying layer 100 and the second region 104, a residue 106b formed of silicon oxide may remain.

In the method MT, in order to remove the residue 106b, a process ST8 (Form modified region) and a process ST9 (Remove modified region) may be further performed. The process ST8 is the same as the process ST1, and the process ST9 is the same as the process ST2. Further, when the process ST8 and the process ST9 are performed in the plasma processing apparatus 10, the control unit 66 may perform the first control and the second control, respectively.

Figure 6B:
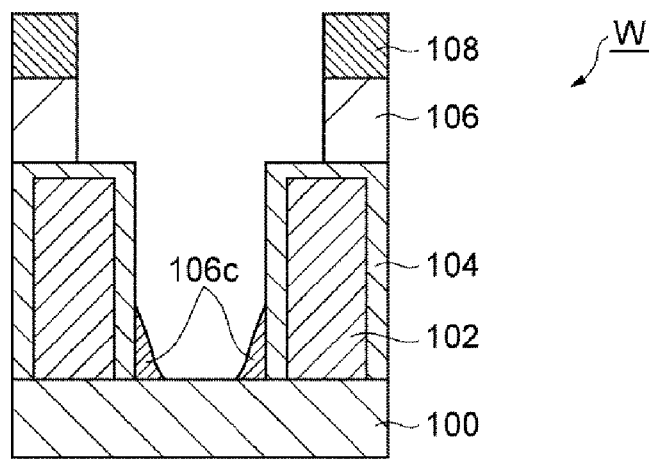
Figure 6C:
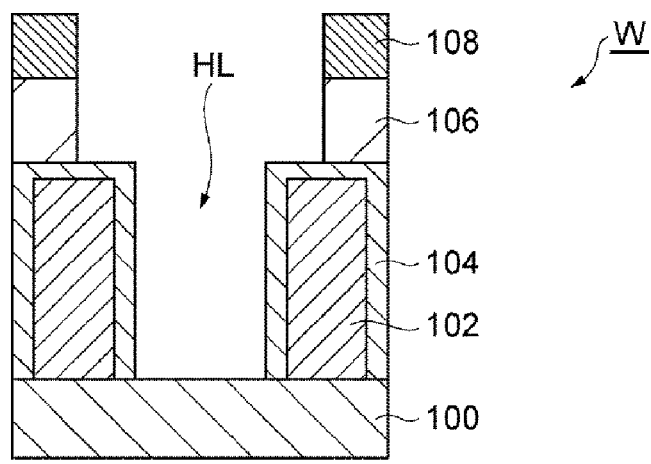

In the process ST8 of the method MT, a modified region 106c may be formed by modifying the residue 106b as depicted in FIG. 6B. Further, the modified region 106c may be removed in the process ST9 as depicted in FIG. 6C. The process ST8 and the process ST9 may be alternately repeated a multiple number of times. Thus, according to the method MT, a hole HL can be formed between the adjacent protruding regions 102 in a self-aligned manner.

Several example embodiments have been described above, but various modifications can be made without being limited to the above-described example embodiments. By way of example, in the above-described example embodiments, all the processes of the method MT are performed in the single plasma processing apparatus 10, but a different apparatus may be used for each process or several processes. Further, although the plasma processing apparatus 10 is configured as a capacitively coupled plasma processing apparatus, a different type of plasma processing apparatus may be used. Various plasma processing apparatuses, e.g., an inductively coupled plasma processing apparatus and a plasma processing apparatus using a plasma source such as a microwave may be used.

Figure 2:
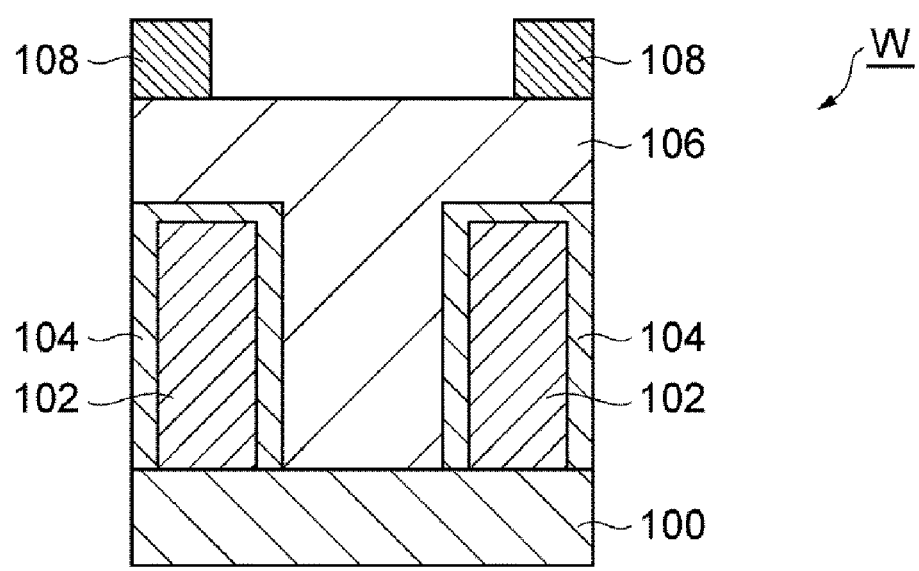
FIG. 2 is a cross-sectional view illustrating an example of a target object.

Further, the process ST1, the process ST2, the process ST7, the process ST8, and the process ST9 of the method MT are optional processes for forming the hole HL in the wafer W depicted in FIG. 2. Therefore, these processes may be unnecessary depending on a wafer. By way of example, if the wafer includes a first region formed of silicon oxide and a second region formed of silicon nitride and the first region and the second region are exposed, a method including the process ST4 and the process ST5 can be performed in order to selectively etch the first region.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An etching method of selectively etching a first region formed of silicon oxide with respect to a second region formed of silicon nitride, the etching method comprising:
    a protective film forming process of forming a protective film such that a thickness of the protective film on the second region is larger than a thickness of the protective film formed on the first region by exposing a target object including the first region and the second region to plasma of a fluorocarbon gas, the fluorocarbon gas being represented by $C_xF_y$; and
    a first region etching process of etching the first region by exposing the target object to plasma of a fluorocarbon gas,
    wherein a high frequency bias power supplied to a mounting table configured to mount the target object thereon in the protective film forming process is set to be lower than a high frequency bias power supplied to the mounting table in the first region etching process, and a temperature of the target object is set to 60° C. or more to 250° C. or less in the protective film forming process.

2. The etching method of claim 1, further comprising:
    a modified region forming process of modifying the first region formed of the silicon oxide into a modified region formed of an ammonium fluorosilicate by generating plasma of a gas containing hydrogen, nitrogen, and fluorine; and
    a modified region removing process of removing the modified region,
    wherein the second region is buried in the first region,
    the protective film forming process and the first region etching process are performed after the second region is exposed through the modified region forming process and the modified region removing process.

3. The etching method of claim 2, wherein the target object is heated in the modified region removing process.

4. The etching method of claim 2,
    wherein the target object is exposed to plasma of an inert gas in the modified region removing process.

5. The etching method of claim 2,
    wherein the modified region forming process and the modified region removing process are alternately performed multiple times.

6. The etching method of claim 1,
    wherein a gas containing at least one of $C_4F_6$, $C_4F_8$, and $C_6F_6$ is used as the fluorocarbon gas in the protective film forming process.

7. The etching method of claim 1,
    wherein the protective film forming process and the first region etching process are alternately performed.

8. The etching method of claim 1,
    wherein the high frequency bias power is not supplied to the mounting table mounting thereon the target object in the protective film forming process.

* * * * *